(12) United States Patent
Peng et al.

(10) Patent No.: US 6,448,158 B2
(45) Date of Patent: Sep. 10, 2002

(54) METHOD OF PATTERNING AN ITO LAYER

(75) Inventors: Chih-Yu Peng, Hsinchu; In-Cha Hsieh, Hsinchu Hsien, both of (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 09/883,969

(22) Filed: Jun. 19, 2001

(30) Foreign Application Priority Data

Aug. 4, 2000 (TW) ........................................ 89115687 A

(51) Int. Cl.⁷ ............................................. H01L 21/20
(52) U.S. Cl. ........................ 438/487; 438/482; 438/486; 438/485
(58) Field of Search ................................ 438/485, 486, 438/487, 488, 482, 166, 243, 151

(56) References Cited

U.S. PATENT DOCUMENTS

| 5,574,293 | A  | * | 11/1996 | Arai et al. .................. 257/59 |
| 5,766,989 | A  | * | 6/1998  | Maegawa et al. ............ 438/166 |
| 5,827,773 | A  | * | 10/1998 | Voutsas ....................... 438/488 |
| 5,938,839 | A  | * | 8/1999  | Zhang ......................... 117/104 |
| 6,071,796 | A  | * | 6/2000  | Voutsas ....................... 438/487 |
| 6,169,013 | B1 | * | 1/2001  | Voutsas ....................... 438/485 |
| 6,184,068 | B1 | * | 2/2001  | Ohtani et al. ............... 438/151 |
| 6,225,197 | B1 | * | 5/2001  | Maekawa ................... 438/487 |
| 6,297,086 | B1 | * | 10/2001 | Hegde et al. ................ 438/243 |
| 6,329,229 | B1 | * | 12/2001 | Yamazaki et al. .......... 438/166 |

* cited by examiner

*Primary Examiner*—David Nelms
*Assistant Examiner*—Thao P. Le
(74) *Attorney, Agent, or Firm*—Darby & Darby

(57) ABSTRACT

A method of patterning an indium tin oxide (ITO) layer is performed on a glass substrate. First, using sputtering, an amorphous ITO layer is deposited on the glass substrate. Then, using excimer laser annealing (ELA), the amorphous ITO layer within a predetermined pattern is turned into a crystalline ITO layer. Finally, using an etch solution, the amorphous ITO layer outside the predetermine pattern is removed.

7 Claims, 3 Drawing Sheets

METHOD OF PATTERNING AN ITO LAYER

BACKGROUND OF THE INVENTION

1. Field of the Invention

The present invention relates to a method of patterning a transparent electrode of Indium Tin Oxide (ITO) and, more particularly, to a method of crystallizing the transparent electrode of ITO.

2. Description of the Related Art

A transparent conductive layer of Indium Tin Oxide (ITO) is practically applied to the fabrication of a contact of contact panel, an electrode of liquid crystal display (LCD), a thermal reflective coating, a gas-sensing sensor, a static electricity-resistance coating, and an abrasion-resistance coating of glass. The ITO layer may be formed by a chemical film-forming method, such as spray, chemical evaporation, or dipping. Alternatively, the ITO layer may be formed by a physical film-forming method, such as vacuum evaporation or sputtering. Generally, sputtering can form an ITO layer of a low resistance and a uniform thickness on a substrate. However, when the ITO layer is then patterned by conventional photolithography and etching with oxalic acid, the patterned ITO layer cannot fit in with the requirements for product properties.

FIG. 1 is a flow chart of a conventional method of patterning an ITO layer. First, at step 10 of sputtering, an amorphous ITO layer is deposited on a substrate. Then, conventional photolithography, which comprises a step 12 of photoresist coating, a step 14 of soft baking, a step 16 of exposure, a step 18 of developing, a step 20 of hard baking, a step 22 of etching by oxalic acid, and a step 22 of photoresist stripping, is carried out on the amorphous ITO layer. The step 14 of soft baking drives out the solvents existing in the photoresist. The step 16 of exposure makes the photoresist absorb appropriate energy so as to proceed with photochemical transformation. The step 18 of developing forms the potential pattern that is transferred to the photoresist. The step 20 of hard baking is used to further reduce the solvent remaining in the photoresist and fix the profile of the patterned photoresist. The step 22 of etching by oxalic acid removes the amorphous ITO layer not covered by the patterned photoresist, thus forming the pattern of the amorphous ITO layer. Finally, at step 26, annealing is performed in an oven to turn the amorphous ITO layer into a crystallized ITO layer. Thus the ITO layer can achieve the expected resistance and transparency.

However, at the step 10 of sputtering with $H_2O$, when the amorphous ITO layer is continuously deposited to reach a thickness of more than 800 Å, the process temperature is lower than the process temperature in the subsequent step 20 of hard baking. Thus, the higher temperature in the step 20 of hard baking causes a microcrystalline phenomenon on the surface of the amorphous ITO layer. Also, when the process temperature is improperly controlled in sputtering or photolithography, the microcrystalline phenomenon can be formed. Since oxalic acid is not the excellent etchant for etching crystallized materials, the step 22 of etching cannot completely remove the crystalline area of the ITO layer and this decreases the accuracy of patterning the ITO layer.

In addition, in the series of steps 12~24,exposured photoresist and developer solution are easily remained on the substrate, thus effecting the properties of the subsequent etching or deposition. Also, the complicated steps 12~26 have high production costs and may cause the substrate to be bended, damaged or contaminated if man-made carelessness and improper process control occur.

Thus, a method of patterning an ITO layer solving the aforementioned problems is called for (desired).

SUMMARY OF THE INVENTION

The present invention provides a method of patterning an ITO layer to pattern and crystallize the amorphous ITO layer at the same time so as to simplify the procedure.

The method of patterning an indium tin oxide (ITO) layer is performed on a glass substrate. First, using sputtering, an amorphous ITO layer is deposited on the glass substrate. Then, using excimer laser annealing (ELA), the amorphous ITO layer within a predetermined pattern is turned into a crystalline ITO layer. Finally, using an etch solution, the amorphous ITO layer outside the predetermine pattern is removed.

Accordingly, it is a principle object of the invention to provide excimer laser annealing for replacing the conventional photolithography process.

It is another object of the invention to use excimer laser annealing to pattern and crystallize the amorphous ITO layer at the same time.

Yet another object of the invention is to simply the method of patterning the ITO layer.

It is a further object of the invention to accurately pattern the ITO layer.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
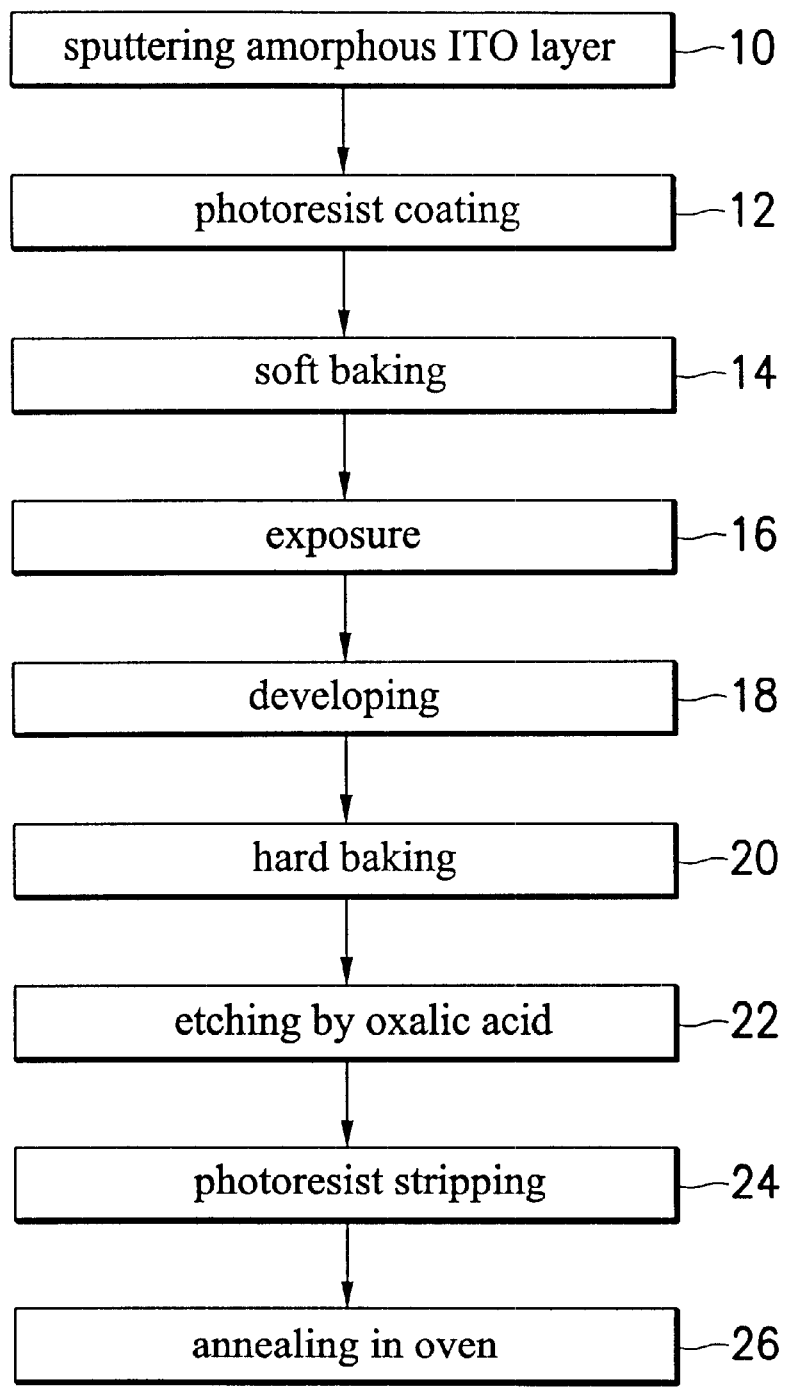
FIG. 1 is a flow chart of a conventional method of patterning an ITO layer.
Figure 2:
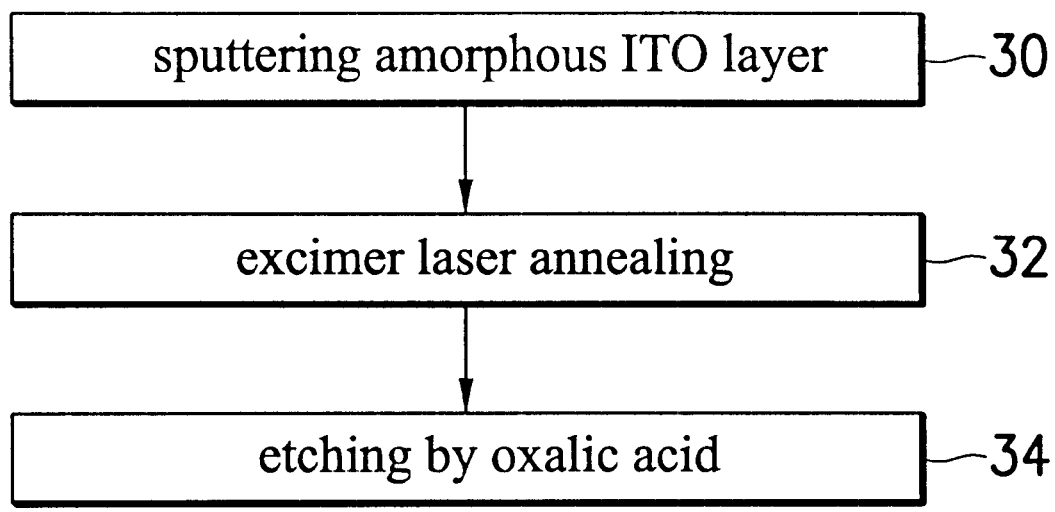
FIG. 2 is a,flow chart of the method of patterning an ITO layer according to the present invention.

The present invention provides a method of patterning an ITO layer that is suitable for fabricating the products, such as thin film transistor (TFT), liquid crystal display (LCD), organic light emitting diode (OLED), and plasma display panel (PDP). Hereinafter, the method of patterning an ITO layer is applied to the formation of a transparent electrode in LCD. FIG. 2 is a flow chart of the method of patterning an ITO layer according to the present invention. First, at step 30 of sputtering with $H_2O$, an amorphous ITO layer of 200~800Å thickness is deposited on a glass substrate. Then, at step 32 of excimer laser annealing (ELA), a high-energy pulsed laser directs laser radiation at selected regions of the amorphous ITO layer to expose the amorphous ITO layer to very high temperatures for short durations. Thus, the amorphous ITO layer is crystallized without damage to the underlying glass substrate, and the crystalline ITO layer achieves the expected resistance and transparency. Finally, the step 34 of etching by oxalic acid removes the amorphous ITO layer outside the selected regions, thus precisely forming the expected pattern of the ITO layer.

Figure 3:
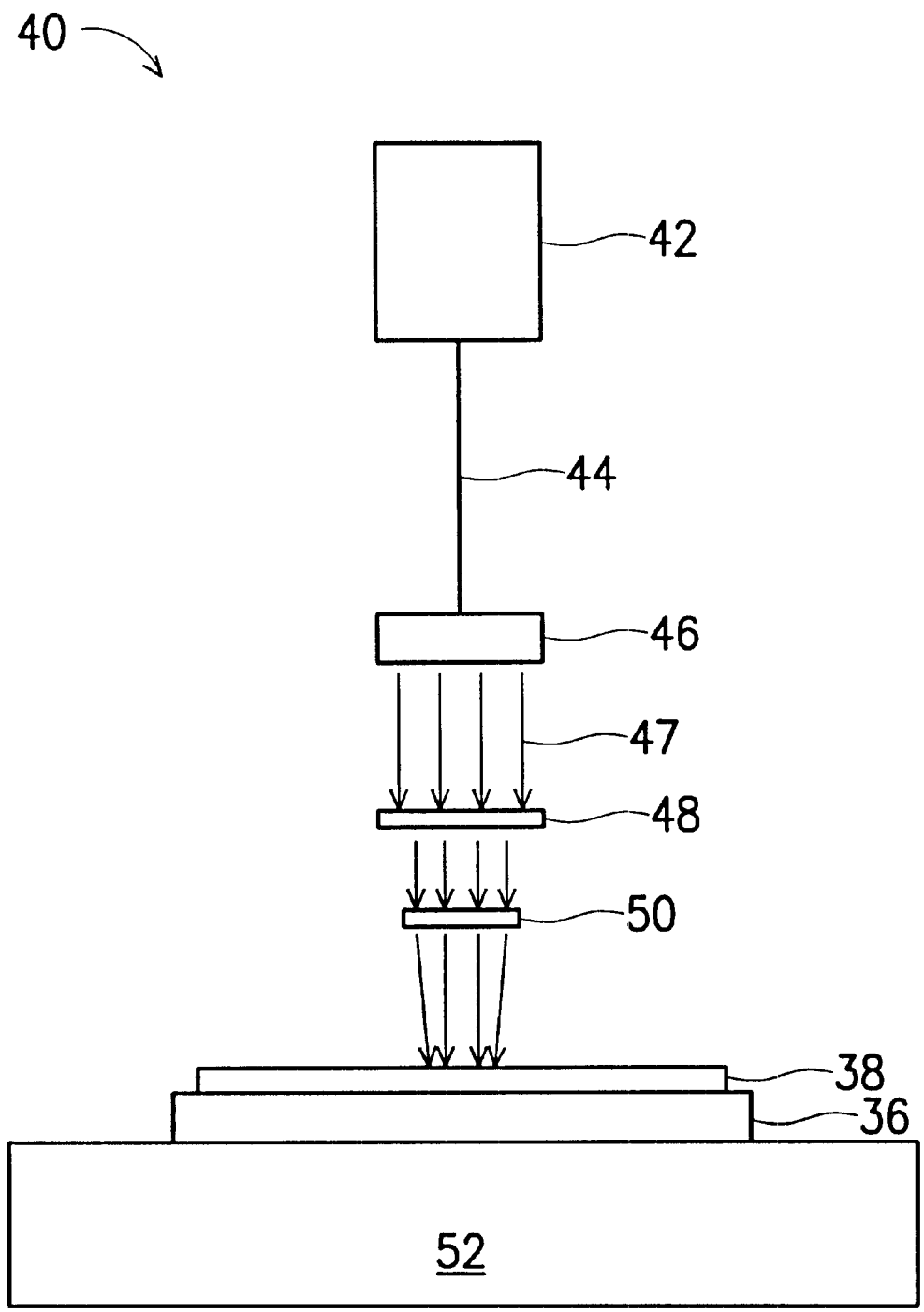
FIG. 3 a schematic diagram of an ELA apparatus for patterning the ITO layer.

FIG. 3 is a schematic diagram of an ELA apparatus for patterning the ITO layer. In an ELA apparatus 40, laser emitter 42 emits a pulsed beam 44 that passes through a beam homogenizer 46. The pulsed beam 44 is a high-energy coherent radiation at a selective wavelength. The use of laser depends on the required design (parameters), for example, XeCl lasers emit UV radiation at a wavelength of 308 nm; KrF lasers operate at a wavelength of 248 nm. The beam homogenizer 46 installed below the laser emitter 42 is an optical system that produces a substantially uniform beam profile. After the pulsed beam 44 passes through the beam homogenizer 46, a homogenized beam 47 of a size between 10 $mm^2$ and 50 $mm^2$ is emerged.

Next, the homogenized beam 47 passes through a patterned photo mask disposed on a reticle scanning stage 48, and then is centralized by a lens 50 to direct irradiate selected regions of an amorphous ITO layer 38 deposited on a glass substrate 36. Thus, the selected regions of the amorphous ITO layer 38 is exposed to very high temperatures for short durations, resulting crystallization in selected regions of the amorphous ITO layer 38.

The glass substrate 36 is placed on a movable stage 52 that can move the glass substrate 36 to a proper position to ensure that the homogenized beam 47 accurately radiates the selected regions on the amorphous ITO layer 38. Alternatively, the movable stage 52 can redirect the pulsed beam 44 to aim it at different target regions on the glass substrate by moving the laser emitter 42 and related optics to a fixed stage. The power level of the laser emitter 42, the duration of the pulsed beam 44, and the size of the homogenized beam 47 determine the number of exposures to the selected region on the glass substrate 36. The ELA apparatus 40 is readily programmed to perform multiple exposures to properly anneal and crystallize the amorphous ITO layer 38. Generally, the power level of the laser emitter 42 is 50~200 $mJ/cm^2$.

In the present invention, the step 32 of ELA replaces the conventional photolithography process. Thus the series of complicated steps of photoresist coating, soft baking, exposure, developing, hard baking, and photoresist stripping are omitted. Also, at the same time when the ITO layer is patterned, the amorphous ITO is turned into crystalline ITO. Therefore, the process of patterning the ITO layer is simplified, and the disadvantages of remaining photoresist, remaining developer solution, bended substrate, and contaminated ITO layer caused by man-made carelessness and improper process control are avoided. Further, compared with performing hard baking on the glass substrate, the present invention exposes the selected regions of the amorphous ITO layer to the high-temperature laser beam for short durations to crystallize the amorphous ITO layer. This can prevent a microcrystalline phenomenon on the surface of the amorphous ITO layer, and therefore the ITO layer is accurately patterned in the subsequent step of etching by oxalic acid.

It is to be understood that the present invention is not limited to the embodiments described above, but encompasses any and all embodiments within the scope of the following claims.

What is claimed is:

1. A method of patterning an indium tin oxide (ITO) layer, comprising steps of:

providing a substrate;

forming an amorphous ITO layer on the substrate;

performing an excimer laser annealing (ELA) with a power level between 50 to 200 $mJ/cm^2$ to turn the amorphous ITO layer within a predetermined pattern into a crystalline ITO layer; and using an etch solution to remove the amorphous ITO layer outside the predetermined pattern.

2. The method according to claim 1, wherein the amorphous ITO layer is formed by sputtering.

3. The method according to claim 2, wherein the sputtering comprises $H_2O$.

4. The method according to claim 2, wherein the amorphous ITO layer has a thickness of 200~800 Å.

5. The method according to claim 1, wherein the etch solution is oxalic acid.

6. The method according to claim 1, wherein the substrate is a glass substrate.

7. The method according to claim 1, wherein the crystalline ITO layer serves as a transparent electrode.

* * * * *